(12) United States Patent
Horio et al.

(10) Patent No.: US 7,608,816 B2
(45) Date of Patent: Oct. 27, 2009

(54) LIGHT RECEIVING MODULE INCORPORATING SHIELD COVER

(75) Inventors: Tomoharu Horio, Kyoto (JP); Hironori Daikoku, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/973,031

(22) Filed: Oct. 5, 2007

(65) Prior Publication Data

US 2008/0099670 A1    May 1, 2008

(30) Foreign Application Priority Data

Oct. 26, 2006   (JP) ............................ 2006-290786

(51) Int. Cl.
*H01J 40/14* (2006.01)
*H01J 5/02* (2006.01)

(52) U.S. Cl. .................... 250/239; 250/208.1; 257/433; 348/842

(58) Field of Classification Search ............. 250/208.1, 250/239, 214.1, 214 R; 348/294, 302, 842; 257/435, 433, 446
See application file for complete search history.

(56) References Cited

U.S. PATENT DOCUMENTS

2004/0080642 A1* 4/2004 Kobayashi et al. .......... 348/294

FOREIGN PATENT DOCUMENTS

JP    2004-335881    11/2004

\* cited by examiner

*Primary Examiner*—Thanh X Luu
*Assistant Examiner*—Francis M Legasse, Jr.
(74) *Attorney, Agent, or Firm*—Hamre, Schumann, Mueller & Larson, P.C.

(57) ABSTRACT

A light receiving module includes a substrate, a light receiving element mounted on the substrate, a resin package covering the light receiving element, and a shield cover into which the resin package is inserted in an insertion direction. The shield cover includes first and second press plates configured to press the resin package in two different directions that are perpendicular to the insertion direction. The first press plate and the second press plate include a first end and a second end, respectively, which are adjacent but different in position in the insertion direction.

3 Claims, 5 Drawing Sheets

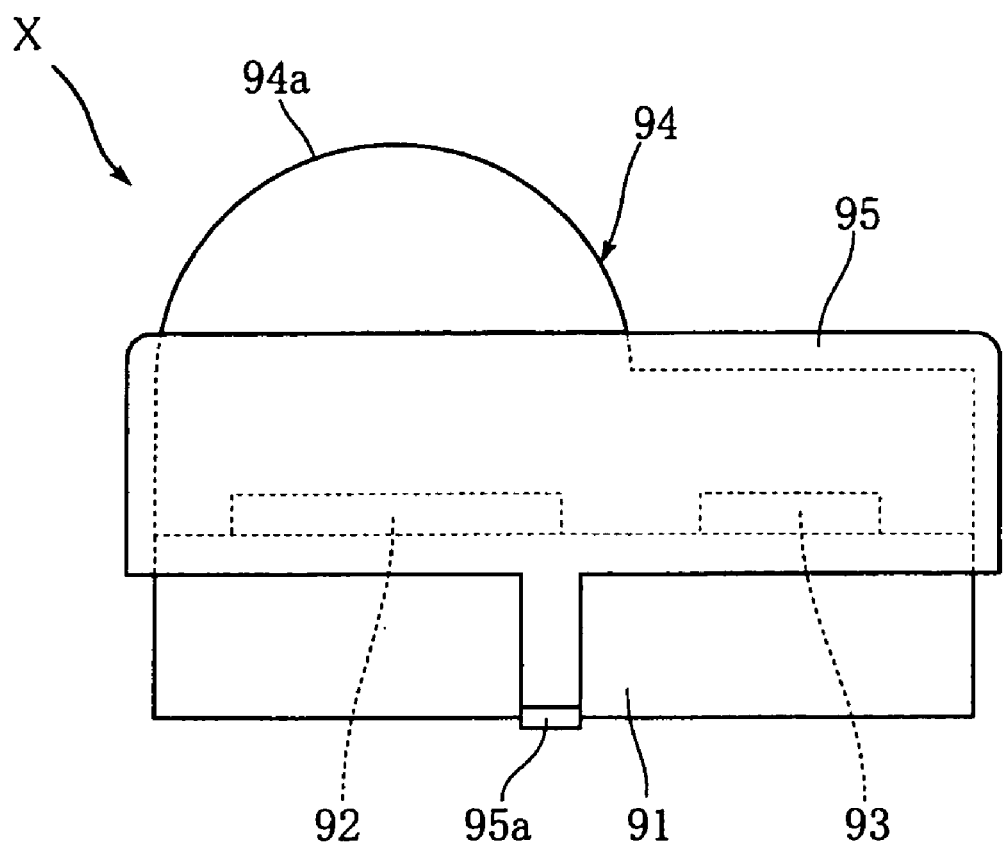

LIGHT RECEIVING MODULE INCORPORATING SHIELD COVER

BACKGROUND OF THE INVENTION

1. Field of the Invention

The present invention relates to a light receiving module used as a remote control receiving means of e.g. a television.

2. Description of the Related Art

FIG. 8 shows an example of conventional light receiving module (see JP-A-2004-335881, for example). The illustrated light receiving module X includes a substrate 91, a light receiving element 92, an IC chip 93, a resin package 94 and a shield cover 95. The light receiving element 92 and the IC chip 93 are mounted on the substrate 1. The light receiving element 92 generates electromotive force corresponding to the amount of infrared rays received. The IC chip 93 transmits a signal or an electric current flowing through the light receiving element 92 to the outside of the light receiving module X. The resin package 94 covers the light receiving element 92 and the IC chip 93. The resin package 94 includes a lens 94a facing the light receiving element 92. The shield cover 95 covers the resin package 94 while allowing the lens 94a to be exposed. The shield cover 95 is provided with a grounding terminal 95a. The shield cover 95 serves as an electromagnetic shield by converting incoming electromagnetic waves into weak electric currents and releasing the currents to an external ground line through the ground terminal 95a. The shield cover 95 may be formed by press working a metal plate.

To manufacture the light receiving module X, care should be taken in mounting the shield cover 95 properly to the resin package 94 on the substrate 91. However, if the inner dimension of the shield cover 95 is too large or too small for the resin package 94, the shield cover 95 fails to be properly positioned relative to the resin package 94, or even the mounting of the shield cover 95 maybe very difficult. Further, in mass-producing the light receiving module X, a large number of shield covers 95 are handled collectively. In such a process, shield covers 95 may get entangled with each other, which deteriorates the manufacturing efficiency of the light receiving module X.

SUMMARY OF THE INVENTION

An object of the present invention, which is proposed under the circumstances described above, is to provide a light receiving module having a structure that facilitates proper mounting of a shield cover.

According to the present invention, there is provided a light receiving module comprising: a substrate; a light receiving element mounted on the substrate; a resin package covering the light receiving element; and a shield cover into which the resin package is inserted in an insertion direction. The shield cover includes a first press plate and a second press plate, where the first press plate is configured to press the resin package in a first direction perpendicular to the insertion direction, and the second press plate is configured to press the resin package in a second direction perpendicular to the insertion direction and different from the first direction. The first press plate and the second press plate include a first end and a second end, respectively, which are adjacent to each other in the insertion direction and different in position from each other in the insertion direction.

With the above arrangement, due to the pressing force of the two press plates, the resin package and the shield cover are properly positioned two-dimensionally as viewed in the insertion direction. Moreover, the space between the ends of the two press plates is reduced. Therefore, in collectively handling a large number of shield covers to manufacture the light receiving modules, the shield covers are prevented from being entangled.

Preferably, the first end and the second end may overlap each other as viewed in the insertion direction when the resin package is separated from the shield cover.

Preferably, the shield cover may include an edge connected to one of the first end and the second end, where the edge is inclined with respect to the insertion direction.

Other features and advantages of the present invention will become more apparent from detailed description given below with reference to the accompanying drawings.

BRIEF DESCRIPTION OF THE DRAWINGS

FIG. 8 is a front view showing a conventional light receiving module.

DETAILED DESCRIPTION OF THE PREFERRED EMBODIMENTS

Figure 1:
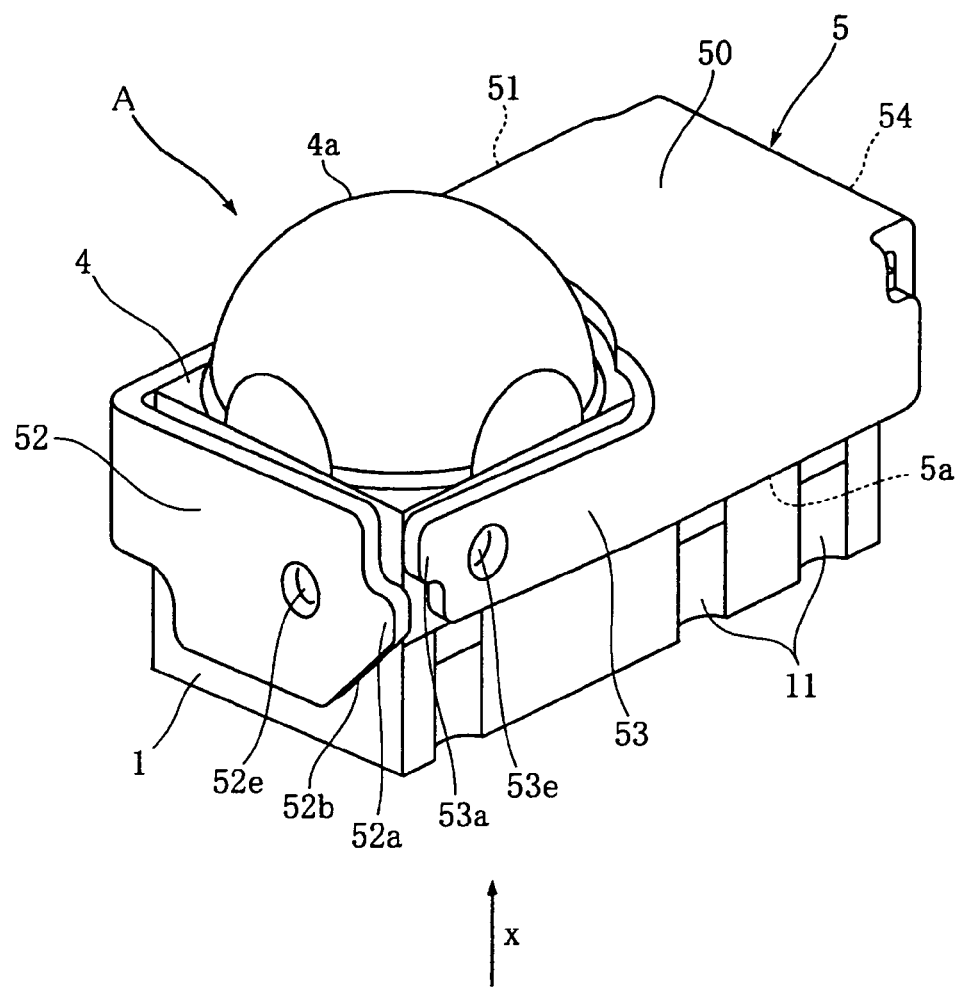
FIG. 1 is a perspective view showing a light receiving module according to the present invention.

Preferred embodiments of the present invention will be described below with reference to the accompanying drawings.

FIGS. 1-6 show an example of light receiving module according to the present invention. The light receiving module A of this embodiment includes a substrate 1, a light receiving element 2, an IC chip 3, a resin package 9 and a shield cover 5. The light receiving module A is an electronic device which may be incorporated in a television set for receiving-signals (e.g. infrared rays) transmitted from a remote controller.

Figure 4:
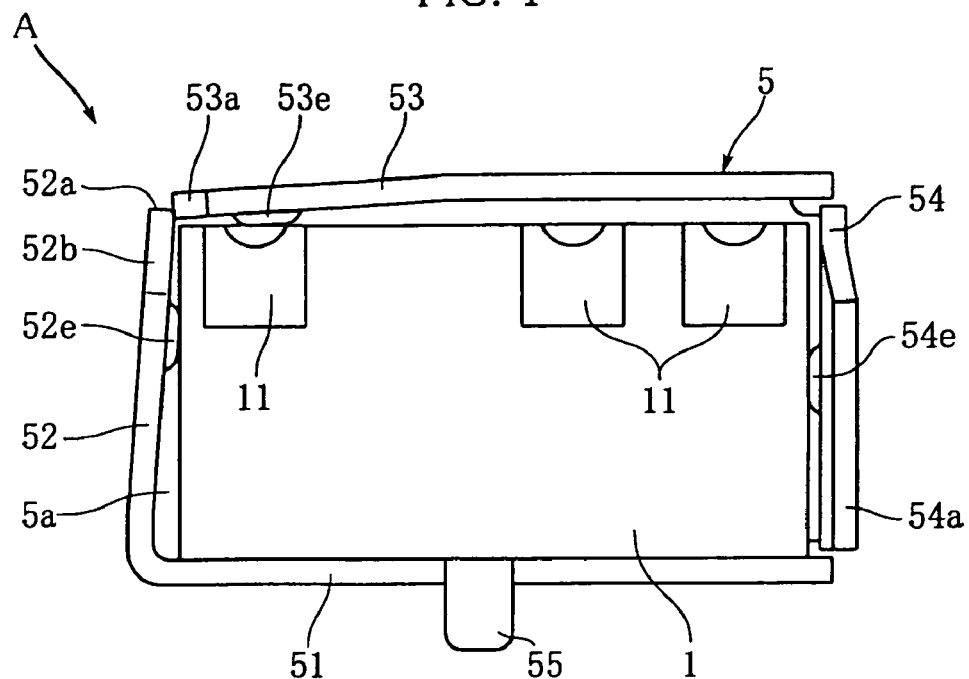
FIG. 4 is a bottom view showing the light receiving module of the present invention.
Figure 5:
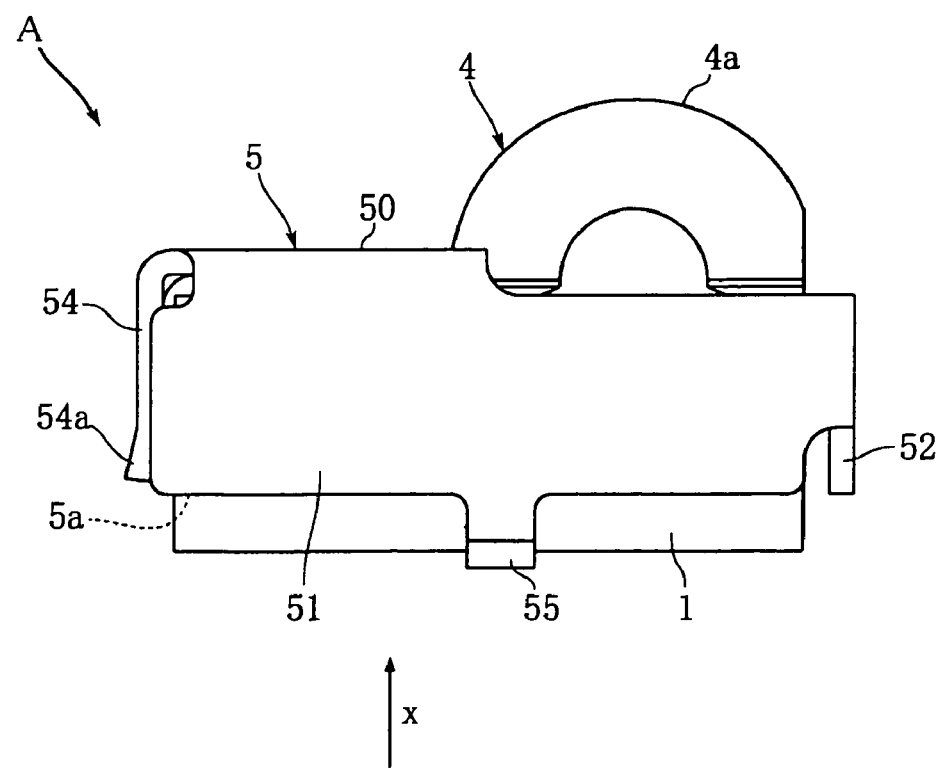
FIG. 5 is a rear view showing the light receiving module of the present invention.

The substrate 1 is made of resin such as glass-fiber-reinforced epoxy resin and formed into an elongated rectangle as viewed in plan. The obverse surface of the substrate 1 is formed with a wiring pattern (not shown) As shown in FIGS. 1 and 4, a plurality of main terminals 11 are provided on a side surface of the substrate 1. Each of the main terminals 11 is provided by forming a conductor layer on an inner surface of a groove extending in the thickness direction of the substrate 1. The main terminals 11 are provided for mounting the light receiving module A on e.g. a circuit board (not shown).

The light receiving element 2 may comprise a PIN photodiode. Upon receiving infrared light from an external remote controller, the light receiving element 2 generates photo electromotive force and hence electric current corresponding to the received light. Though not shown, the light receiving element 2 has a PAN junction structure comprising a p-type semiconductor layer as an upper layer and an n-type semiconductor layer as a lower layer. The light receiving element 2 is wire-bonded to the wiring pattern on the substrate 1.

The IC chip 3 converts the current flowing through the light receiving element 2 into signals and outputs the signals to an external controller. The IC chip 3 may include a current/voltage conversion circuit, an amplifying circuit, a limiter circuit and a detector circuit. The IC chip 3 is wire-bonded to the wiring pattern on the substrate 1.

Figure 3:
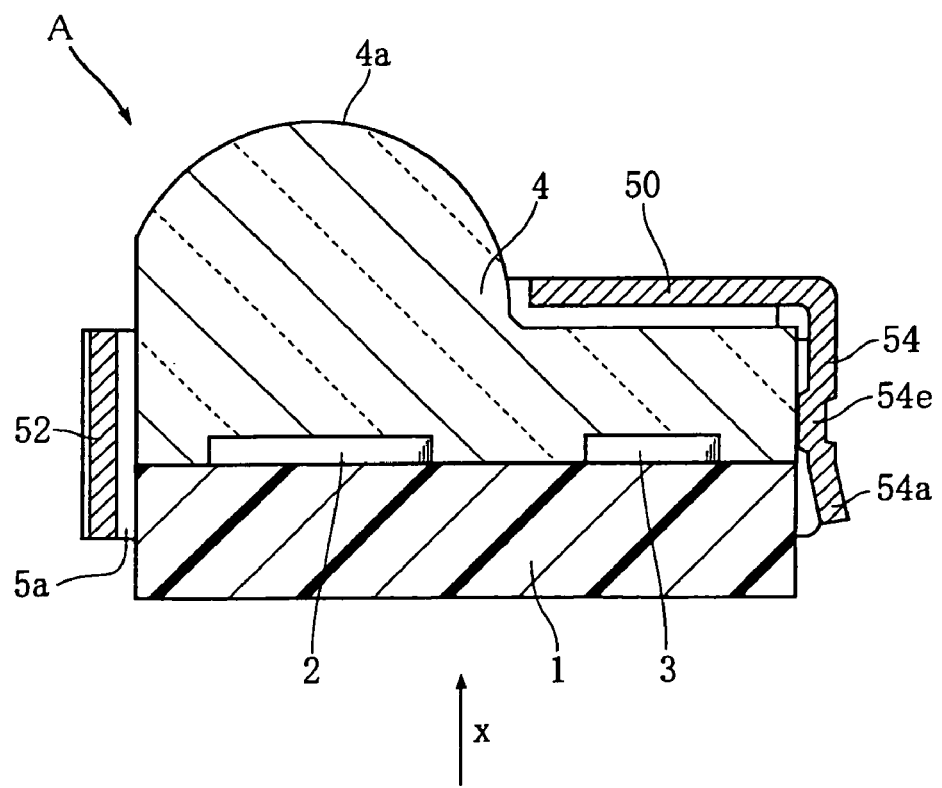
FIG. 3 is a sectional view taken along lines III-III in FIG. 2.

The resin package 4 may be made of an epoxy resin containing a colorant, so that it allows the passage of infrared rays but blocks visible light completely or to a required degree. The resin package 4 encloses the light receiving element 2 and the IC chip 3 for protection. As shown in FIG. 3, the resin package 4 is formed with a convex lens 4a facing the light receiving element 2. The lens 4a refracts the infrared rays from the remote controller to cause the infrared rays to converge on the light receiving element 2.

Figure 6:
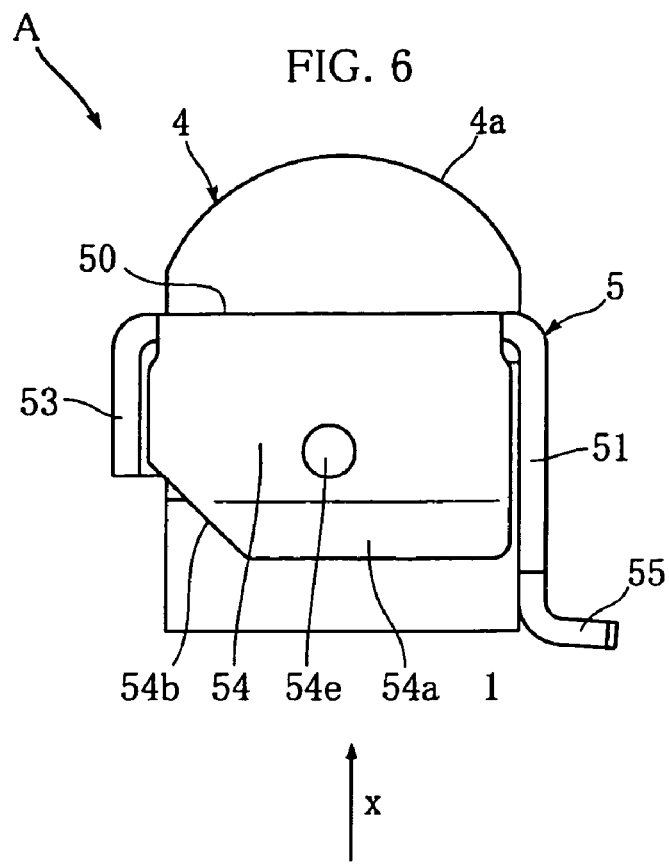
FIG. 6 is a side view showing the light receiving module of the present invention.

The shield cover 5 shields the IC chip 3 from electromagnetic waves and light. The shield cover 5 covers the resin package 4 in a manner such that the lens 4a is exposed. The shield cover 5, which may be made by bending a metal plate, includes a top plate 50, a rear plate 51, two press plates 52, 53, and a side plate 54. As shown in FIG. 4, a lower opening 5a is defined by the rear plate 51, two press plates 52, 53 and the side plate 54. Through the opening 5a, the resin package 4 is inserted into the shield cover 5 in the direction x shown in FIGS. 1 and 3. As shown in FIGS. 3 and 6, the side plate 54 is formed with an inclined portion 54a. The inclined portion 54a facilitates the insertion of the resin package 4 into the shield cover 5.

The top plate 50 covers a portion of the resin package 4 that is adjacent to the lens 4a. The top plate 50 is formed integral with the rear plate 51, the press plate 53 and the side plate 54. The rear plate 51 covers a rear side surface of the resin package 4. The rear plate 51 is formed with a ground terminal 55. The ground terminal 55 is to be connected to a ground line which is a part of the wiring pattern of the substrate 1. The ground terminal 55 conducts the unwanted electric current (converted from the electromagnetic wave received by the shield cover 5) to the ground line. The press plate 52 extends from the rear plate 51.

As shown in FIGS. 1 and 4, the press plate 52 presses the resin package 4 in a direction perpendicular to the insertion direction x. With this arrangement, the resin package 4 is held by the press plate 52 and the side plate 54. The press plate 52 is formed with an embossed portion 52e projecting toward the resin package 4. The side plate 54 is formed with an embossed portion. 54e projecting toward the resin package 4. By holding the resin package 4 between the embossed portions 52e and 54e, the resin package 4 is positioned properly relative to the shield cover 5 in the direction in which the press plate 52 and the side plate 54 are spaced from each other.

The press plate 53 presses the resin package 4 in a direction perpendicular to both of the insertion direction x and the pressing direction of the press plate 52. Thus, the resin package 4 is held not only by the press plate 52 and the side plate 54 but also by the press plate 53 and the rear plate 51. The press plate 53 is formed with an embossed portion 53e. By holding the resin package 4 between the inner surface of the rear plate 51 and the embossed portion 53e, the resin package 4 is properly positioned relative to the shield cover 5 in the direction in which the press plate 53 and the rear plate 51 are spaced from each other.

Figure 2:
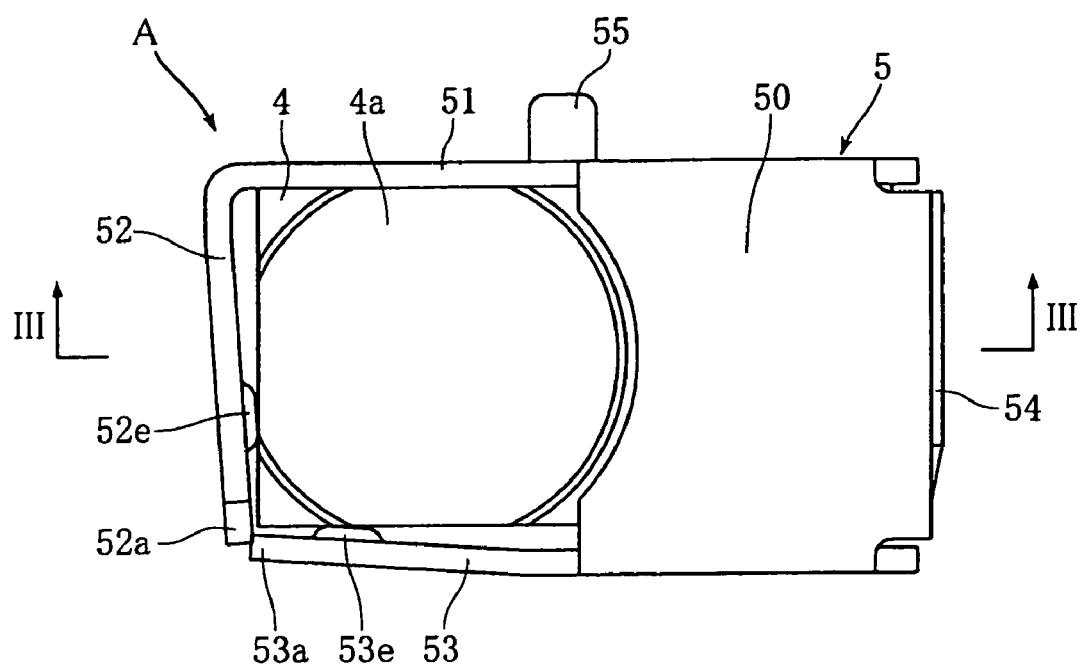
FIG. 2 is a plan view showing the light receiving module of the present invention.
Figure 7:
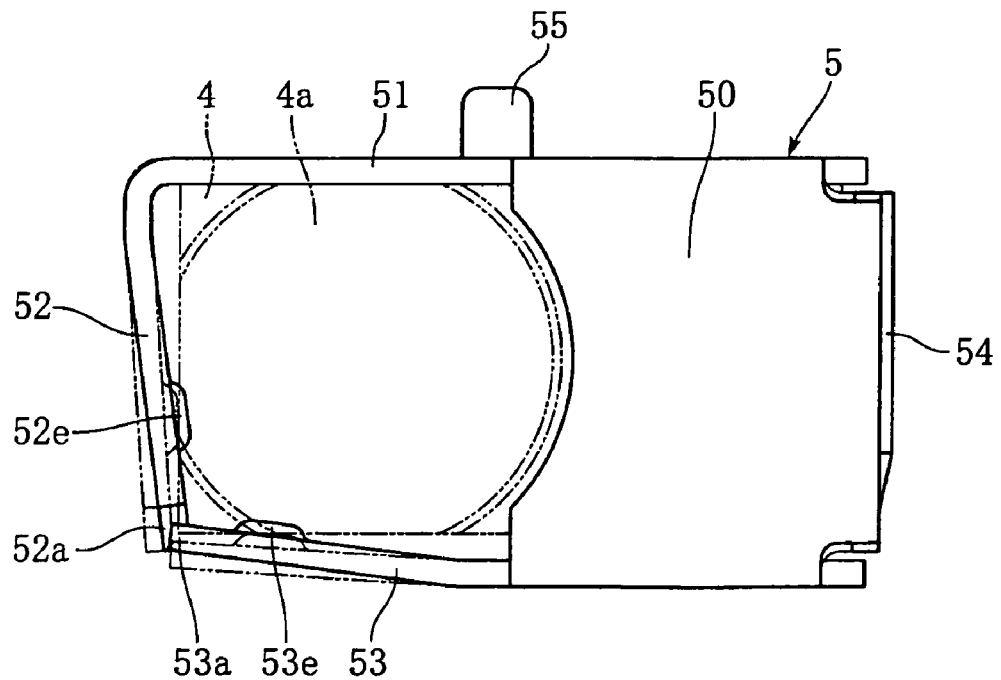
FIG. 7 is a plan view showing a shield cover of the light receiving module of the present invention.

As shown in FIG. 1, the press plates 52 and 53 include ends 52a and 53a. When the resin package 4 is inserted into the shield cover 5, the ends 52a and 53a are positioned adjacent to each other as viewed in the insertion direction x, as shown in FIGS. 1, 2 and 4. Further, as shown in FIG. 1, the positions of the ends 52a and 53a in the insertion direction x differ from each other. FIG. 7 shows the shield cover 5 in the state before the resin package 4 is inserted. In this state, as viewed in the insertion direction x, the ends 52a and 53a overlap each other. This is because the press plates 52 and 53 are bent in advance in the direction in which the resin package 4 is to be held. When the resin package 4 is inserted into the shield cover 5, the press plates 52 and 53 are warped outward by the resin package 4. The elastic force generated in this way at the press plates 52 and 53 works as the pressing force to press the resin package 4. As shown in FIG. 1, the press plate 52 includes an inclined edge 52b connected to the end 52a. As shown in FIG. 6, the side plate 54 includes an inclined edge 54b. The angle of inclination of the inclined edges 52b and 54b with respect to the insertion direction x is about 45 degrees.

The advantages of the light receiving module A will be described below.

According to the above-described embodiment, in manufacturing the light receiving module A, the resin package 4 and the shield cover 5 are precisely positioned relative to each other just by inserting the resin package 4 into the shield cover 5. Particularly, the two press plates 52 and 53 press the resin package 4 in the directions which are perpendicular to each other. Therefore, the two-dimensional positioning of the resin package 4 and the shield cover 5 as viewed in the insertion direction x is performed properly.

In mass-producing light receiving modules A, a large number of shield covers 5 may be stored in e.g. a part feeder. In each of the shield covers 5, the end 52a of the press plate 52 and the end 53a of the press plate 53 differ from each other in position in the insertion direction x, so that the ends 52a and 53a completely overlap each other as viewed in the insertion direction x. Therefore, it is possible to avoid a situation where part of a shield cover 5 is caught between the press plates 52 and 53 of another shield cover 5. Therefore, in collectively handling a large number of shield covers 5, the shield covers 5 are prevented from getting entangled.

The provision of the inclined edges 52b and 54b at the shield cover 5 is advantageous for preventing the tangling of the shield covers 5. If a corner portion having an interior angle of 90 degrees or smaller is provided instead of the inclined edge 52b, 54b, the corner portion may be caught between the press plates 52 and 53 of another shield cover 5 due to wedge effect. According to the present invention, such tangling of the shield covers 5 is prevented from occurring.

To bond the resin package 4 and the shield cover 5 together, an adhesive may be used. The adhesive may be applied between the top plate 50 and the resin package 4. When the resin package 4 is inserted into the shield cover 5, the adhesive may be pushed out from between the top plate 50 and the resin package 4. If the adhesive pushed out adheres to the lens 4a, the reception of infrared rays by the light receiving element 2 may be hindered. In this embodiment, however, due to the provision of the embossed portions 53e and 54e at the press plate 53 and the side plate 54, a relatively large space is defined between the resin package 4 and the press plate 53 or the side plate 54. Therefore, the adhesive pushed out by the insertion of the resin package 4 is held in the space. Therefore, the adhesive is prevented from adhering to the lens 4a.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. A light receiving module comprising:
   a substrate;
   a light receiving element mounted on the substrate;
   a resin package covering the light receiving element; and
   a shield cover into which the resin package is inserted in an insertion direction;
   wherein the shield cover includes a first press plate and a second press plate, the first press plate being configured to press the resin package in a first direction perpendicular to the insertion direction, the second press plate being configured to press the resin package in a second direction perpendicular to the insertion direction and different from the first direction,
   wherein the first press plate includes a first end, the second press plate including a second end separate from the first end of the first press plate, the first end and the second end being adjacent to each other in the insertion direction and deformable separately from each other for allowing both the first press plate and the second press plate to come into pressing contact with the resin package.

2. The light receiving module according to claim 1, wherein the first end of the first press plate is positioned immediately under the second end of the second press when the resin package is separated from the shield cover.

3. The light receiving module according to claim 1, wherein the shield cover includes an edge connected to the first end of the first press plate, the edge being inclined with respect to the insertion direction.

* * * * *